United States Patent
Geiler

(10) Patent No.: US 10,081,105 B2
(45) Date of Patent: Sep. 25, 2018

(54) METHOD FOR VERIFYING THE ASSIGNMENT OF A DRIVE TO A CONTROL DEVICE

(71) Applicant: KUKA Roboter GmbH, Augsburg (DE)

(72) Inventor: Torsten Geiler, Augsburg (DE)

(73) Assignee: KUKA Roboter GmbH, Augsburg (DE)

( * ) Notice: Subject to any disclaimer, the term of this patent is extended or adjusted under 35 U.S.C. 154(b) by 0 days.

(21) Appl. No.: 14/967,890

(22) Filed: Dec. 14, 2015

(65) Prior Publication Data
US 2016/0167230 A1   Jun. 16, 2016

(30) Foreign Application Priority Data
Dec. 16, 2014   (DE) .......... 10 2014 226 008

(51) Int. Cl.
| | |
|---|---|
| *B25J 9/06* | (2006.01) |
| *B25J 9/16* | (2006.01) |
| *G01R 31/40* | (2014.01) |
| *G01R 31/34* | (2006.01) |
| *G01R 31/28* | (2006.01) |

(52) U.S. Cl.
CPC .......... *B25J 9/1674* (2013.01); *B25J 9/06* (2013.01); *B25J 9/1692* (2013.01); *G01R 31/40* (2013.01); *G01R 31/2829* (2013.01); *G01R 31/343* (2013.01); *G05B 2219/21157* (2013.01); *G05B 2219/42301* (2013.01); *Y10S 901/09* (2013.01)

(58) Field of Classification Search
CPC . B25J 9/06; G05B 2219/42301; Y10S 901/09
See application file for complete search history.

(56) References Cited

U.S. PATENT DOCUMENTS

| | | | |
|---|---|---|---|
| 5,659,480 A * | 8/1997 | Anderson | B23Q 1/623 318/567 |
| 5,825,150 A | 10/1998 | Kachi et al. | |
| 6,563,281 B1 | 5/2003 | Ramstrom et al. | |
| 6,717,382 B2 | 4/2004 | Graiger et al. | |
| 6,973,356 B2 | 12/2005 | Bieber | |
| 8,483,851 B2 | 7/2013 | Stummer et al. | |
| 2004/0212392 A1 | 10/2004 | Hauser et al. | |
| 2007/0119841 A1* | 5/2007 | Nakata | B23K 9/0671 219/137.71 |
| 2007/0277586 A1* | 12/2007 | Kamiya | G01P 15/18 73/1.38 |

(Continued)

FOREIGN PATENT DOCUMENTS

JP     2000181521     6/2000

OTHER PUBLICATIONS

The extended European Search Report, dated Jun. 10, 2016, in the related European Patent Appl. No. 15195138.1.

(Continued)

*Primary Examiner* — Muhammad S Islam

(57) ABSTRACT

A method for verifying the assignment of a drive to a control device of an industrial robot. A drive, comprising at least one actuator and a motion sensor, is assigned to one of the axles of the robot. The assignment is verified by outputting a suitable test signal from the control device to the drive, and comparing the output test signal with motion signals generated by the motion sensor.

17 Claims, 4 Drawing Sheets

(56) References Cited

U.S. PATENT DOCUMENTS

2009/0059446 A1* 3/2009 Matsui ............... H02P 29/0241
                                                    361/31
2011/0004343 A1* 1/2011 Iida ....................... B25J 9/1638
                                                    700/253
2014/0097859 A1   4/2014 Matsumura et al.

OTHER PUBLICATIONS

Examination Report from GPTO in DE Appl. No. 10 2014 226 008.6, dated Jul. 22, 2015.
The English translation of the Korean Office Action, dated Apr. 7, 2017, in the related Korean Patent Appl. No. 10-2015-0178299.

* cited by examiner

METHOD FOR VERIFYING THE ASSIGNMENT OF A DRIVE TO A CONTROL DEVICE

This application claims the benefit of priority under 35 § 119(a) to German Patent Application No. 10 2014 226 008.6, filed on Dec. 16, 2014.

1. FIELD OF THE INVENTION

The present invention relates to a method for verifying the assignment of a drive to a control device of a machine having a plurality of axles. The method can be used in particular for the initiation of newly installed robotic systems. The invention further relates to a corresponding assembly and a computer-readable medium.

2. BACKGROUND

During initiation of an industrial robot, it is necessary to connect the drives of the axles with the control device of the industrial robot, that is, assign the correct drives to the control device. The connection is typically established by wiring the components by means of signal lines. An industrial robot generally means a manipulating machine that is equipped for automatic manipulation of objects with suitable tools and that is programmable in a plurality of axes, in particular with regard to orientation, position, and process sequence. Industrial robots typically include a control device and a robot arm having a plurality of axles and, optionally, links that are moved by drives which are controlled by the control device. A link typically forms a mechanical connection between the joints of two axles.

A control device that controls an industrial robot having at least two drives, i.e., at least two signal inputs and outputs, in practice has the problem that the components of the drive of the control device must be correctly assigned, i.e., the wiring between the drive and control device must be correct.

A drive typically comprises at least one actuator and one motion sensor, which each must be connected to a signal output, i.e. with a signal input of the control device. When the control device sends control signals to the drive, the actuator causes the links of the industrial robot to move accordingly, which is detected by the motion sensor. The motion sensor then sends corresponding motion signals to the control device, whereby the control loop is closed.

The assignment of the drive to the control device, in particular, the wiring of the various components, is usually carried out manually at the installation site of the industrial robot. During wiring, two basic types of errors can occur, both on the actuator side as well as the sensor side. They are inversion of signal lines and interchanging of signal lines. In the case of inversion, the polarity of the signal lines is reversed such that the direction of action of the actuator reverses or the direction information of the motion signal is given inverted. Interchanging of the signal lines results in drives being connected to incorrect outputs or inputs of the control device, i.e., interchanging results in a motion and/or a control signal that is incorrectly assigned to the drive and thus in a control loop that is not closed or closed incorrectly. As a result, the control device is no longer able to cause the desired movements of the axles intended by the control program.

Before initiation, the assignment is verified and, if necessary, an incorrect assignment is resolved. For this purpose, a initiation engineer commonly uses suitable commands to have the robot execute individual movements in order to verify the assignment. The verifications of the movements are done visually. Subsequently, the wiring is adjusted or the control program is changed manually. These corrections are necessary, in particular because incorrectly assigned drives are potentially dangerous. For example, if an axle under the effect of gravity is held at standstill by an actuator via a closed loop (i.e., compensating for the effect of gravity) and there is an inversion of the actuator-side signal lines, the control may cause the algorithm, which compensates for the gravity, to accelerate the actuator in the direction of gravity.

In addition, initiation by a initiation engineer is time-consuming and error-prone.

The object of the present invention is to eliminate or reduce the disadvantages described above by an inventive method according to claim 1.

3. DETAILED DESCRIPTION

One aspect relates to a method for verifying the assignment of drives of a machine having a plurality of axles, wherein a drive is assigned to each of the axles and wherein each drive comprises at least one actuator and one motion sensor, which is assigned to the axle to be moved by the drive, to a control device which is configured to control the machine by means of a control program, comprising the following method steps:
  a) the control device outputs a test signal to at least one drive;
  b) in response to the test signal, the actuator of this drive causes corresponding movements of the axles of the machine;
  c) the assigned motion detector detects the movement and sends corresponding motion signals to the control device, and
  d) the control device compares the test signal with the motion signals to detect a phase shift $\varphi$, an inversion, and/or a change of the amplitude k.

The method for verifying the assignment of a drive to a control device is intended in particular to detect errors in the assignment and, preferably, to determine the correct assignment.

The method can be performed on machines with a plurality of axles drivable by assigned drives, preferably on a robot, particularly preferably on an articulated-arm robot or an industrial robot, and more preferably on a tool machine or a workpiece processing machine, such as an articulated-arm robot, a milling machine, a drill, a press etc.

To perform the method, a machine or a robot having a plurality of axles is provided. The axles are each assigned a drive, wherein each drive comprises at least one actuator and one motion sensor, which is assigned to the axle to be moved by the drive. The actuator is preferably an electric motor, but it can also be a hydraulic or pneumatic actuator that performs rotational or translational movements. Typical motion sensors used are incremental encoders and preferably absolute encoders, which are based on resistive, inductive, capacitive, or optical measuring methods. In addition, a control device is provided according to the method which is configured to control the industrial robot by means of a control program via control signals.

The control device outputs a test signal to a drive (Step a)). The test signal is preferably a periodic signal and repeats with a period T. Examples include sine waves, square waves, or sawtooth signals, but any other periodic signals may also be used. A test signal is a control signal which causes the actuators of the robot to carry out certain movements suitable for verifying the assignment.

In response to the test signal, the actuator causes corresponding movements of the links of the industrial robot (Step b)). The motion detector assigned to the actuator or the link or the axle detects the movement and sends corresponding motion signals back to the control device (Step c)). Both terms, motion signal and control signal, will be used here in the singular as well as in the plural without implying a restriction to one or a plurality of signals.

The control device compares the test signal with the motion signals in order to detect a phase shift, an inversion, and/or a change of the amplitude (Step d)). Here, the test signal preferably has a profile that enables the detection of an inversion independently of the phase shift. Preferably, steps a) to d) are repeated for all the drives.

A phase shift results, for example, from inertia, such as inertia in the drive. As a result, the test signal is converted to movements with a time delay, resulting in a phase shift in the measured motion signal. A change in the amplitude can be produced, for example, by the gear ratio of a gearing used in the drive. The gear ratio here affects the factor by which the amplitude changes. If the gear ratio "i" is the ratio of input speed to output speed, the amplitude increases for i>1 and the amplitude decreases for i<1.

As mentioned in the introduction, an inversion can occur on both the actuator side and sensor side. An actuator-side inversion occurs in the case of polarity reversal/inversion of signal lines carrying the test signal. As a result, the actuator rotates/moves in the direction opposite of the command. If the actuator is to rotate clockwise, for example, and there is an actuator-side inversion, the actuator will perform an counterclockwise rotational movement.

A sensor-side inversion occurs in the case of polarity reversal/inversion of signal lines carrying the motion signal. As a result, the motion sensor sends a motion signal indicating a motion direction opposite to the actual direction of movement. If the actuator rotates clockwise, for example, and there is a sensor-side inversion, the motion sensor will send a signal to the control device indicating a counterclockwise motion direction. In practice, sensor-side inversion during initiation can be prevented in many cases by means of special and elaborate sensor wiring. However, the sensor-side inversion can be a problem as well, especially if there is no suitably coded sensor wiring. Advantageously, however, the method can be used to verify the correct actuator-side wiring in any case, so that it is possible to simplify the initiation or verification in any case.

To be able to reliably distinguish a phase shift of the signal from an inversion of the signal, it should be ensured that, for a periodic test signal, a signal that is shifted by half of the period of the signal (T/2), for example, differs from an inverted signal. With a sine signal, for example, a phase shift of T/2 is equivalent to an inversion so that it is not distinguishable. For other waveforms, however, such as for a sawtooth signal, the inverted signal does not correspond to the signal shifted by T/2. This is because of the differently formed rising and falling slopes of the signal. If they have different slopes, a distinction of inversion from a phase shift is possible. The flanks do not have to form a first degree function, but only need to differ in their slope.

Preferably, the test signal specifies different accelerations, speeds, and/or paths to be traversed for both directions of movement of the actuator. This can be achieved, for example, with a sawtooth signal or a sawtooth-like signal. The term "sawtooth-like signals" as used herein includes all waveforms having differing rising and falling slopes. The range of the signal corresponding to the reversal of the direction of the actuator can be flattened for control reasons or formed as a continuously differentiable function.

For periodic signals, the period of the test signal is preferably appropriately selected in order to reliably distinguish a phase shift from an inversion. If the maximum occurring phase shift of the system (=drive) is known, for example, a reliable distinction can also be achieved by choosing a test signal with a period that is longer than twice the maximum phase shift—regardless of the form of the slopes of the test signal.

Typically, the connection is done by wiring the components with signal lines. Alternatively, the connection can be done without cables, for example, with suitable radio connections. If, for simplicity, "wiring" of the connections is mentioned herein, this shall always include wireless connections as well unless explicitly stated otherwise.

Furthermore, the control device preferably comprises a corresponding number of signal inputs, which must be assigned to the respective motion sensors. Preferably, each of one signal input and one signal output of the control device form an I/O pair. Such an I/O pair is used to close a control loop. The assignment of a drive to a control device thus comprises the assignment of the signal outputs of the control device to the actuators of the respective actuators, as well as the assignment of the signal inputs of the control device to the motion sensors of the respective drives. For a correct assignment, an I/O pair is assigned both the corresponding actuator of the drive and the motion sensor associated with the drive without inversion.

Preferably, the control device initially outputs the test signal at a first signal output of the control device to verify the correct assignment. Consequently, the links of the drive associated with signal output are moved. By monitoring all the signal inputs of the control device, the motion signal which originates from the moving link can be detected even if the sensor of the corresponding drive is not assigned to the correct I/O pair. For example, if the actuator of the drive is assigned to a signal output of a first I/O pair and the motion sensor of the drive is (incorrectly) assigned to a signal input of a second I/O pair, then the motion signal output at the first signal output will be detected at the second signal input. After receiving the motion signal at one of the signal inputs, the determined assignment is displayed or saved. Therefore, by outputting the test signal to only one drive and simultaneous monitoring of all signal inputs, the actually existing assignment of the drive to the control device can be verified. By repeating the steps a) to d) of the method, the assignment of all drives can thus be verified.

Preferably, the control device compares the test signal with the received motion signals in order to detect the phase shift $\varphi$ and/or the change of the amplitude k. Preferably, the phase shift $\varphi$ and/or the change in the amplitude k is characteristic for each drive and known, i.e., target values for each drive are available to the control device. As already explained, the phase shift can be, for example, a measure of the inertia and the change in amplitude can be a measure of the gear ratio of a drive. The control device can thus distinguish between the individual drives, using these target values.

Likewise, the control device can detect an inversion of the signal by comparing the test signal and the received motion signal. If such an inversion is present, the signal lines of the actuator or of the motion sensor are inverted. An exemplary approach for inversion detection is explained with reference to FIGS. 6A-6E.

One aspect relates to an arrangement of a machine, particularly of a robot, having at least two drivable axles and a control device, wherein the control device is configured to perform the method according to the invention.

Another aspect relates to a computer-readable medium on which instructions are stored, which, when loaded to a suitable control device and executed, executes the method according to the invention.

The control device may comprise both hardware and software that is necessary to control the industrial robot. The control device may be divided physically and/or logically to perform control tasks at several locations. Furthermore, a control program can be directly fed to the control device.

The control program, which comprises the relevant method steps of the invention, can be provided to the control device, for example, via a computer-readable medium or may be stored on a computer-readable medium in the control device itself which the control device can access. Furthermore, the control device may comprise a programming device, which is connected to the control device for at least a limited period of time, for example, to change the control program of the control device or introduce a modified control program.

4. DESCRIPTION OF PREFERRED EMBODIMENTS

In the following, preferred embodiments will be explained in more detail with reference to the accompanying figures. In the figures, FIG. 1 shows an industrial robot as a preferred embodiment of a machine having a control device;

Figure 1:
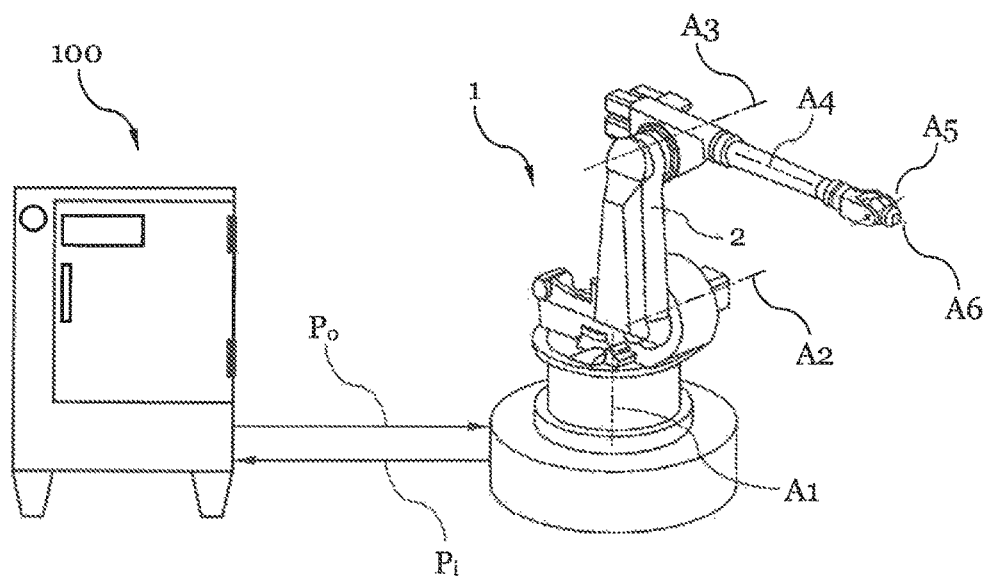

FIG. 1 shows an industrial robot 1 with an associated control device 100. Via the control signals $P_o$, the drives of the industrial robot assigned to the axles A1-A6 can be controlled. In response to the controlling control signal, the actuator of the respective drive causes corresponding movements of the links 2 of the industrial robot 1. These movements are detected by the motion sensors and a motion signal $P_i$ is returned to the control device.

Figure 2:
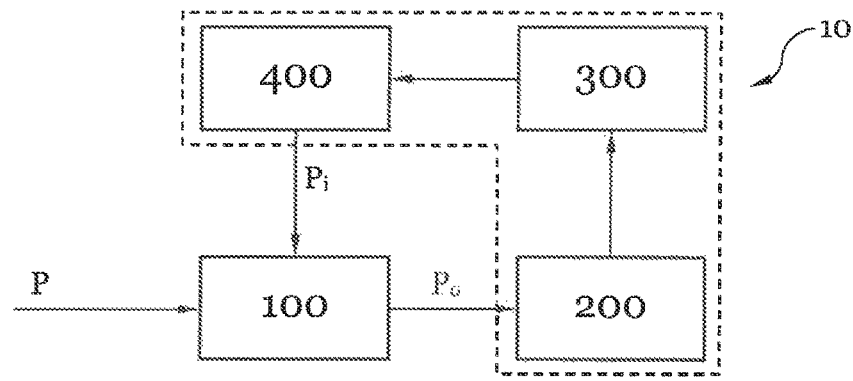
FIG. 2 shows a schematic representation of a closed control loop of a drive.

FIG. 2 shows a schematic closed control loop of a drive. The control program P here provides the actual values of the movement to be executed by the industrial robot 1 and causes the control device 100 to send control signals $P_o$ to the drive 10. The drive preferably comprises at least one control device 200, at least one actuator 300, and at least one motion sensor 400. The triggering device may also be integrated in the control device. However, the risk of an incorrect assignment of the actuators remains due to the integration of the control device and, as a result, the method is applicable analogously.

The triggering device 200 controls the actuator 300 based on the control signals $P_o$. If electric motors are used, the triggering device 200 provides the motor current, for example. For hydraulic or pneumatic actuators, the volume flow or the pressure is controlled accordingly. The movements of the links of the industrial robot 1 initiated by the actuator 300 are detected by the motion sensors 400 and corresponding motion signals $P_i$ are sent to the control device 100, thus closing the control loop. Preferably, the amplitude of the test signal is selected such that the amplitude of movement of the moving link in the event of translational movement is less than 1 cm, preferably less than 0.5 cm, and more preferably less than 1 mm, and, in the case of a rotational movement of the link, is less than 1 degree, preferably less than 0.5 degrees, and more preferably less than 0.1 degrees.

Figure 3:
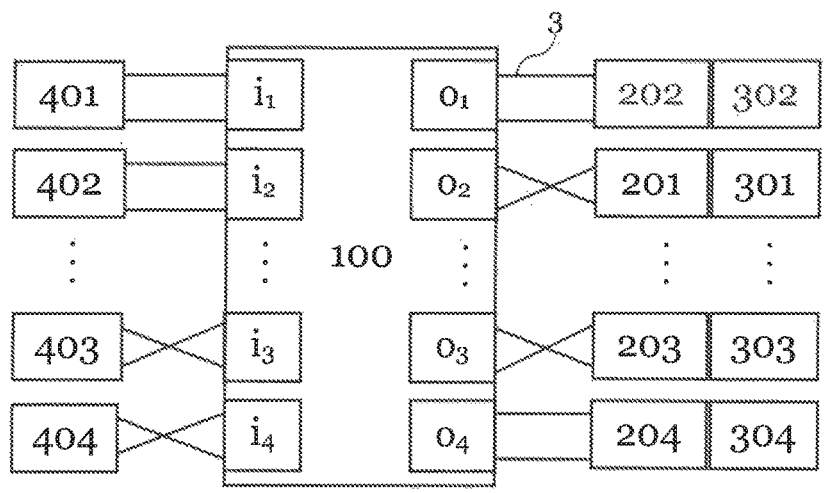
FIG. 3 shows an exemplary assignment of a plurality of drives to a control device.

FIG. 3 shows an exemplary assignment of a plurality of drives (here: four drives) to a control device 100. The control device 100 here comprises, for example, at least four signal outputs $o_1$-$o_4$ and four signal inputs $i_1$-$i_4$. Via signal outputs $o_1$-$o_4$, the control signals or the test signals are sent to the four triggering devices 201-204 of the four drives and the four actuators 301-304 are controlled accordingly. The motion sensors 401-404 detect the movement and send the motion signals to the control device 100 via the signal inputs $i_1$-$i_4$. The individual drives in the illustrated embodiment are each comprised of one control device 20x, one actuator 30x, and one sensor 40x. The variable "x" can accordingly have the values 1-4 and thus defines the individual drives x=1-4. A correct assignment of the drives to the control device 100 is given if the drive x=1 is assigned to the I/O pair ($i_1$, $o_1$) and the drives x=2-4 are assigned accordingly. Furthermore, for a correct assignment, the signal lines 3 must not cross. This representation corresponds to an inversion. The exemplary assignment of FIG. 3 shows inversions of the signal lines 3, which occur between the signal outputs $o_1$-$o_4$ and the drives (actuator-side) and between the motion sensors and the signal inputs $i_1$-$i_4$ (sensor-side). A double inversion occurring on only one drive (see x=3) is also possible. In addition, the drives (x=1-4) may be assigned to the incorrect I/O pairs (interchanged), as shown for the drives x=1, 2.

Figure 4:
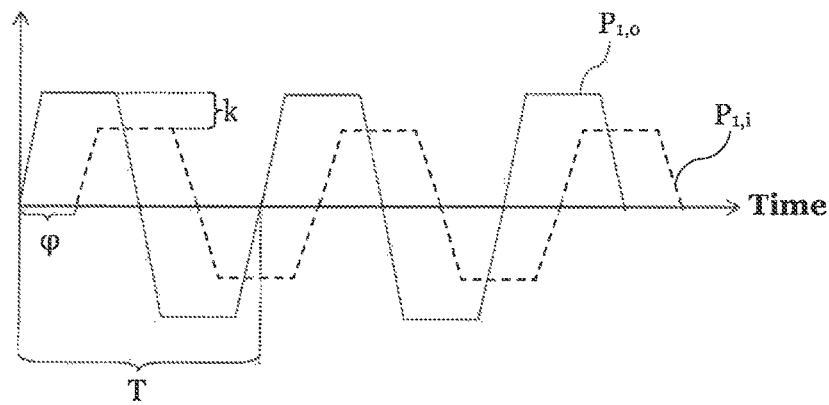
FIG. 4 shows a periodic test signal and a motion signal having a phase shift and a change in amplitude.

FIG. 4 shows a periodic test signal $P_{1,o}$ and a motion signal $P_{1,i}$. Test signal $P_{1,o}$ is shown as a solid line while the motion signal $P_{1,i}$ is shown as a broken line. As this shows, the drive, which comprises at least one actuator and one motion sensor, represents a system-theoretically sufficient linear transmission link. The motion signal $P_{1,i}$ which is dependent on the test signal $P_{1,o}$, appears at the signal input of the control device with a changed amplitude k and a phase shift φ. The test signal as well as the motion signal have the period T. The periodic test signal $P_{1,o}$ shown has similar rising and falling slopes. In order to distinguish between a phase shift and an inversion of the motion signal, the period T in this case is chosen to be longer than twice the maximum occurring phase shift (T>2φ).

Figure 5:
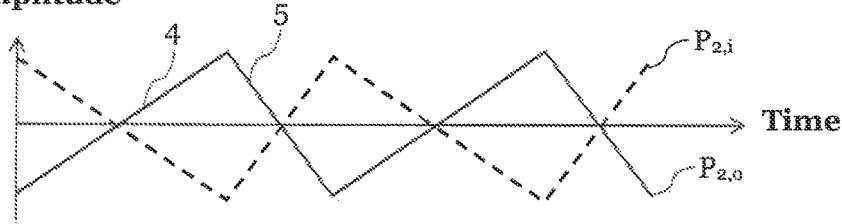
FIG. 5 shows a periodic sawtooth-like test signal and a motion signal having an inversion.

FIG. 5 shows a particularly preferred sawtooth-like, periodic test signal $P_{2,o}$ and a corresponding (i.e., resulting) motion signal $P_{2,i}$, wherein the motion signal $P_{2,i}$ here has an inversion. The test signal $P_{2,o}$ is shown as a solid line while the motion signal $P_{2,i}$ is shown as a broken line. The use of a sawtooth-like periodic test signal, such as a sawtooth signal, allows for the detection of a signal inversion regardless of the phase shift, making sawtooth-like periodic test signals particularly advantageous. The sawtooth-like periodic test signals are favorable in that the rising and falling slopes are formed differently. In particular, they have different slopes.

The test signals of FIGS. 4 and 5 are particularly helpful for the case regularly occurring in practice in which an incorrect assignment of the motion sensors is excluded for other reasons and only the correct assignment of the actuators is to be verified. The person skilled in the art will appreciate that, in such cases, the signal does not necessarily have to be periodic, but that a single test signal with a rising and a falling slopes may be sufficient.

FIGS. 6A-6E show the periodic sawtooth-like test signal of FIG. 5 and corresponding motion signals as well as signals $S_{E,i}$ indicative of the energy consumption of the actuator. The signals $S_{E,i}$, indicative of the energy, may be representative, for example, of the motor current of an actuator. Preferably, these signals $S_{E,i}$, indicative of the energy consumption of the actuator 300, are additionally provided to the control device 100. The control device 100 compares these signals $S_{E,i}$ with the motion signals $P_{2,i}$ and the test signal $P_{2,o}$ in order to detect the directions of movement of the actuator 100 independently of the motion signals $P_{2,i}$ in axles under the effect of gravity. Thus, an inversion of the signal lines can be detected both on the sensor-side, as well as on the actuator-side.

Figure 6:
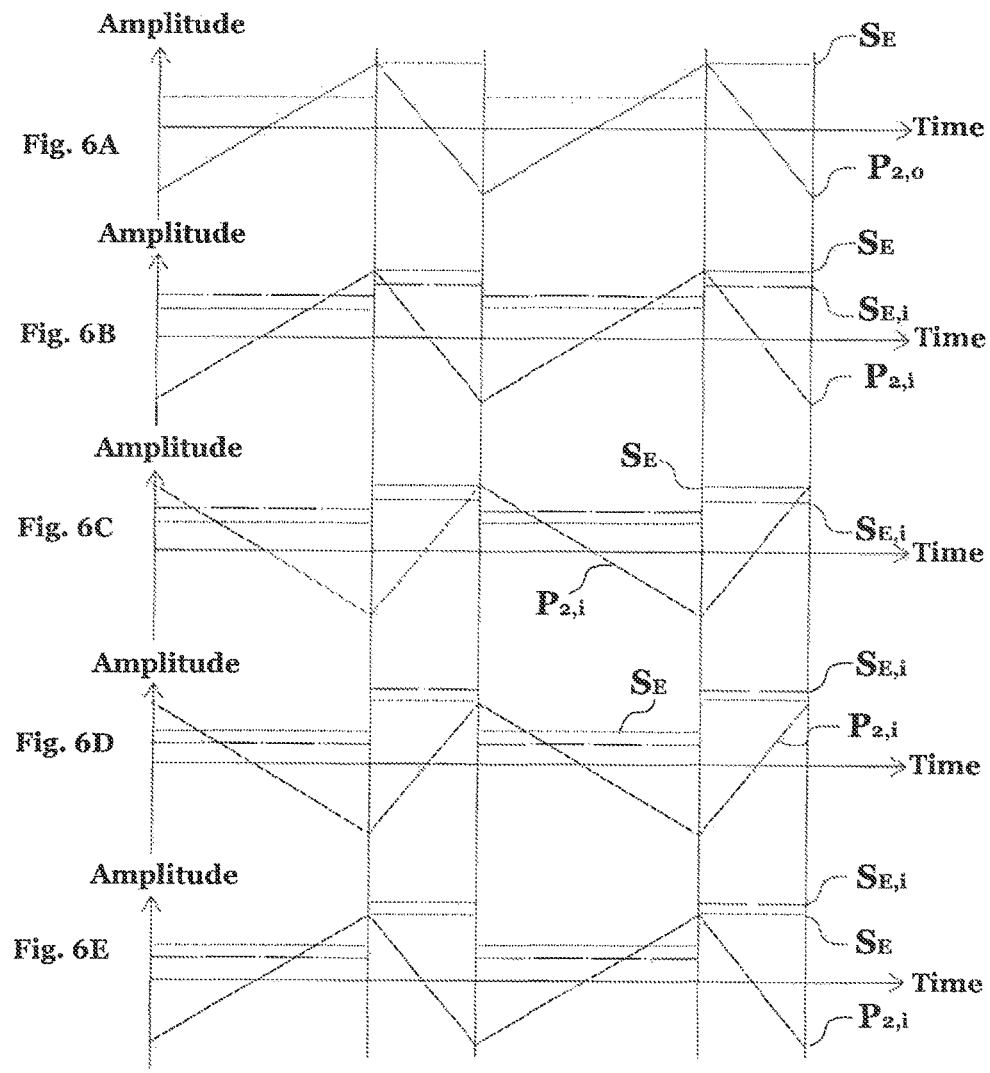
FIGS. 6A-6E show the periodic sawtooth-like test signal of FIG. 5 and corresponding motion signals and signals indicative of the energy consumption of the actuator.

If an inversion of the signal line is detected, it is important in some cases to determine whether the inversion occurs on the sensor-side or on the actuator-side. While actuator-inversions may cause an incorrect direction of movement, sensor-side inversions result in incorrect direction of movement information. For a correct assignment of the drive, both cases of inversions must be distinguishable. Furthermore, it is advantageous to be able to also detect double inversions, i.e., an inversion occurring simultaneously on the actuator-side and the sensor-side on only one drive, namely in the cases where a sensor-side inversion cannot be excluded in other ways. In the case of a double inversion, a seemingly correct motion signal is returned to the control device 100. Such a case is shown on drive x=3 in FIG. 3. The distinction between the individual inversion cases is shown in FIGS. 6B-6E and explained below:

FIG. 6A shows a sawtooth-like test signal $P_{2,o}$, wherein the test signal is the basis for the motion signals $P_{2,i}$ shown in FIGS. 6B-6E. The test signal $P_{2,o}$ can specify the motor speed, for example. The shown signal $S_E$ is a signal indicative of the energy consumption of the actuator, which would occur in the form shown if the drive drove an axle not subjected to gravity. It is therefore a fictitious signal. This fictitious signal $S_E$ is shown as a dotted line as a reference value in the FIGS. 6B-6E. The required energy of the actuator for a rising slopes of the test signal is lower than for a falling slopes since the rising slopes is flatter. This represents, for example, a lower speed of movement (or lower speed of the motor). For the explanation of FIGS. 6B-6E, it is assumed that the actuator moves the axle against the force of gravity with the rising slopes 4 (see FIG. 5) of the test signal $P_{2,o}$. Consequently, the axle moves with gravity with the falling slopes 5.

FIGS. 6B-6E show the motion signals $P_{2,i}$ and the signals $S_{E,i}$ of the drive, which are indicative of energy, for an axle subjected to gravity. Herein, FIG. 6B shows an assignment of the drive without inversion, FIG. 6C shows an assignment of the drive with sensor-side inversion, FIG. 6D shows an assignment of the drive with actuator-side inversion, and FIG. 6E shows an assignment of the drive with a double inversion. It turns out that all the cases are distinguishable based on the signals $P_{2,i}$ and $S_{E,i}$. For the purpose of simplification, the representation of a phase shift and a change in amplitude has been omitted. However, these may occur regardless of the described method.

As shown in FIG. 6B, a correct assignment results in a motion signal $P_{2,i}$ corresponding the test signal $P_{2,o}$. The signal $S_{E,i}$, indicative of energy, however, differs from the fictitious signal $S_E$. This is because the actuator uses more energy when the axle is moved against gravity than if the axle is not subject to gravity. While the actuator is moving the axle against gravity, which corresponds to the rising slopes of the test signal $P_{2,o}$, the actuator is thus provided with more energy. The level of the signal $S_{E,i}$ is consequently higher than the fictitious signal $S_E$. Accordingly, the level of the signal $S_{E,i}$ for the falling slopes of the test signal $P_{2,o}$ is below the fictitious signal $S_E$, which corresponds to a movement of the axle with the force of gravity. Gravity therefore supports the movement of the actuator so that less energy is consumed.

The sensor-side inversion shown in FIG. 6C results in a signal $S_{E,i}$, indicative of energy, that is identical to that shown in FIG. 6B since the drive actually performs the same movement due to the test signal $P_{2,o}$. The energy requirement is therefore equal. However, due to the inversion of the signal line of the motion signal $P_{2,i}$, an inverted motion signal $P_{2,i}$ results.

The actuator-side inversion shown in FIG. 6D results in an inverted motion signal $P_{2,i}$. However, the inversion can be distinguished from the sensor-side inversion due to the different form of the signal $S_{E,i}$, indicative of energy. This is reflected in the comparison of the signal $S_{E,i}$, indicative of energy, and the fictitious signal $S_E$. The actual energy consumption of the actuator for the commanded direction of movement against gravity (rising slopes) is lower than that assumed by the fictive signal. I.e., even though the test signal $P_{2,o}$ requests a movement against gravity, less energy is required by the actuator. A comparison between $S_{E,i}$ and $S_E$ shows that the actuator must be connected incorrectly, regardless of the signal the motion sensor outputs.

FIG. 6E shows the case of double inversion. Here the motion signal $P_{2,i}$ corresponds to the test signal $P_{2,o}$. However, the signal $S_{E,i}$, indicative of energy, is formed as shown in FIG. 6D. The direction of movement against gravity according to the signal $S_{E,i}$, indicative of energy, would require less energy than the reference signal $S_E$, presenting a contradiction. This can be detected by the control device and indicates that the actuator is connected incorrectly.

With the cases shown in FIGS. 6A-6E, not only is it possible to detect an occurring inversion. Rather, it is also possible to distinguish between actuator-side and sensor-side inversions. Thus, the point where the inversion is occurring can be determined.

Figure 7:
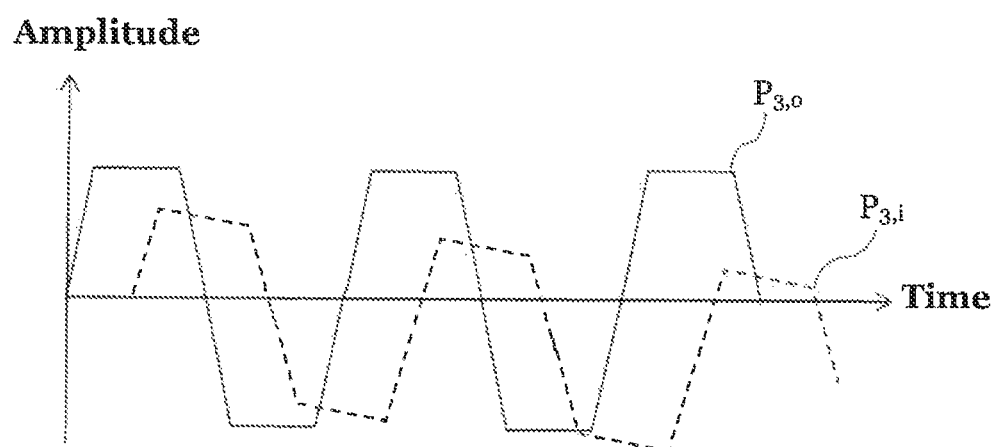
FIG. 7 shows a periodic test signal and a motion signal having a phase shift, a change in amplitude as well as a change of the slopes slope.

FIG. 7 shows a periodic test signal $P_{3,o}$ and a motion signal $P_{3,i}$, having a phase shift, a change in amplitude, as well as a change of the slope incline. The evaluation of the slopes slope can be used to detect the directions of movement of the actuator 100 independently of a signal, indicative of energy, in spite of occurring inversions.

According to this embodiment, at least one axle A1-A6 of the industrial robot 1 is an axle subjected to gravity or is subject to a force for the purpose of verifying the correct assignment. The control device 100 compares the slope of the corresponding slopes of the test signal $P_{3,o}$ and the motion signal $P_{3,i}$.

The test signal $P_{3,o}$ is shown as a solid line in FIG. 7 while the motion signal $P_{3,i}$ is shown as a broken line. The test signal $P_{3,o}$ can specify an actuator moment, for example. The motion signal $P_{3,i}$ preferably reflects a speed. A change of the slope incline in the motion signal indicates a force acting alongside the actuator moment because the moving link is accelerated in the direction of the force or is decelerated by the force. The actuator moment is the moment generated by the actuator. The additional acting force is gravity, for example, or a force applied to the drive. The control device 100 compares the slope of the corresponding slopes of the test signal $P_{3,o}$ and the motion signal $P_{3,i}$. If a deviation of the slopes slope is detected, it can be inferred that the drive subjected to an additional force. In the case of a steeper slope of the motion signal $P_{3,i}$ the drive is substantially moved with the additional force and, in the case of a flatter slopes, it is substantially moved against the acting additional force. Analogously to the explanations for FIG. 6A-6E, it is thus possible to detect the location of the inversion within the assignment of a drive as well as detect double inversions (see drive x=3, FIG. 3).

In an advantageous development, the control device 100 transfers the determined assignment of drives x=1-4 and of the motion sensors 401-404 to the control program P. In the control program P, the saved assignment is changed accordingly so that the correct assignment is not made by changing the connection of the drives or motion sensors on the control device. This can compensate for an interchange and an inversion of the signal lines. The machine or the robot is not limited to a certain number of drives and motion sensors, but rather adapts to any number of drives, the assignment of which to a control device can be determined by the method.

It should be noted that the invention claimed herein is not limited to the described embodiments, but may be otherwise variously embodied within the scope of the claims listed infra.

5. REFERENCE NUMBER LIST

1: industrial robot
2: link
3: signal line
4: rising slopes
5: falling slopes
10: drive
100: control device
200: triggering device
201-204: triggering devices
300: actuator
301-304: actuators
400: motion sensor
401-404: motion sensors
A1-A6: axles
$i_1$-$i_4$: signal inputs of the control device
$o_1$-$o_4$: signal outputs of the control device
$P_o$: control signal
$P_{1,o}$; $P_{2,o}$: periodic test signal
$P_{3,o}$: periodic, sawtooth-like test signal
$P_i$: motion signal
$P_{1,i}$-$P_{3,i}$: motion signals
$S_E$: signal-energy consumption of the actuator
$S_{E,i}$: signal-energy consumption of the actuator when subjected to gravity
k: change in amplitude
T: period
φphase shift

The invention claimed is:

1. A method for verifying an assignment of a plurality of drives of a machine having a plurality of axles to a control device, wherein each of the plurality of drives is assigned to a corresponding one of the axles and comprises a triggering device, an actuator and a motion sensor, wherein the control device is coupled to each of the triggering devices and the motion sensors via associated signal lines, and wherein the control device is configured to control the machine by means of a control program, the method comprising:
   a) the control device outputting a test signal to the triggering device of one of the drives;
   b) in response to the test signal, the triggering device actuating the actuator of the one drive to move a corresponding axle to which the one drive is assigned, wherein the test signal comprises a periodic signal decreasing and increasing in amplitude to cause the corresponding axle to move in respective directions alternatingly aligned with an additional applied external force and against the additional applied external force, and wherein a slope of an amplitude of the test signal indicates whether the additional applied external force is aligned with or against a direction of movement of the corresponding axle;
   c) the motion sensor of the one drive detecting movements of the axle both in directions with or against the additional applied external force, and sending a corresponding motion signal to the control device, and
   d) the control device comparing the test signal with the corresponding motion signal to detect at least one of a cross of the signal lines coupling the control device to the triggering device or a cross of the signal lines coupling the control device to the motion sensor,
   wherein in comparing the test signal with the corresponding motion signal to detect the at least one cross, the comparison includes at least one of a step of detecting an inversion of the corresponding motion signal relative to the test signal or a step of detecting an alternate indicator of a direction of the additional applied external force with or against the movement of the axle that is opposite to the direction indicated by the slope of the amplitude of the test signal.

2. The method according to claim 1, wherein the test signal includes at least one of different accelerations, different speeds, or different paths to be traversed in the respective directions alternatingly aligned with the additional applied external force and against the additional applied external force.

3. The method according to claim 1, wherein the control device repeats the steps a) to d) for each of the plurality of drives.

4. The method according to claim 1, wherein the test signal has a period that is at least twice as longer as a period associated with a maximum phase shift value.

5. The method according to claim 1, further comprising the step of the control device generating a message that at least one of a cross of the signal lines coupling the control device to the triggering device or a cross of the signal lines coupling the control device to the motion sensor has been detected.

6. The method according to claim 1, wherein:
   the additional applied external force is a gravitational force, and
   the step of detecting an alternate indicator comprises the step of detecting an indicator of a level on energy consumption for the actuator of the at least one drive.

7. The method according to claim 1, wherein the test signal triggers a movement amplitude of a link of the machine, which is less than 1 cm or triggers a rotational movement of the link which is less than 1 degree.

8. The method according to claim 1, further comprising the step of the control device comparing the test signal with the corresponding motion signal in order to measure at least one of a phase shift or a change in amplitude, wherein target values of the phase shift or the change in amplitude are known for each drive, and wherein the control device compares the measured phase shift or the change in amplitude with the target values of for the drive.

9. The method according to claim 1, wherein the machine comprises a robot.

10. The method according to claim 7, wherein the movement amplitude is less than 0.5 cm.

11. The method according to claim 7, wherein the movement amplitude is less than 1 mm.

12. The method according to claim 7, wherein the rotational movement is less than 0.5 degrees.

13. The method according to claim 7, wherein the rotational movement is less than 0.1 degrees.

14. The method according to claim 9, wherein the machine comprises an articulated-arm robot.

15. A machine having a plurality of driven axles and a control device configured to control the machine by means of a control program, wherein the control device is configured to verify an assignment of a plurality of drives to the plurality of axles, wherein each of the plurality of drives is assigned to one of the axles and comprises a triggering device, an actuator and a motion sensor, each drive being further assigned to the control device, wherein:
- the control device is configured to output a test signal to the triggering device of one of the drives,
- the triggering device is configured, in response to the test signal, to actuate the actuator of the one drive to move a corresponding axle to which the one drive is assigned, wherein the test signal comprises a periodic signal decreasing and increasing in amplitude to cause the corresponding axle to move in respective directions alternatingly aligned with an additional applied external force and in a direction against the additional applied external force, and wherein a slope of an amplitude of the test signal indicates whether the additional applied external force is aligned with or against the direction of movement of the axle,
- the motion sensor of the one drive is configured to detect movements of the axle both in directions with or against the additional applied external force, and send a corresponding motion signal to the control device; and
- the control device is further configured to compare the test signal with the corresponding motion signal to detect at least one of a cross of the signal lines coupling the control device to the triggering device or a cross of the signal lines coupling the control device to the motion sensor,
- wherein in comparing the test signal with the corresponding motion signal to detect at least one cross, the comparison includes at least one of a step of detecting an inversion of the motion signal relative to the test signal or a step of detecting an alternate indicator of a direction of the additional applied external force with or against the movement of the axle that is opposite to the direction indicated by the slope of the amplitude of the test signal.

16. The machine according to claim 15, further comprising the step of the control device generating a message that at least one of a cross of the signal lines coupling the control device to the triggering device or a cross of the signal lines coupling the control device to the motion sensor has been detected.

17. A non-transitory computer-readable storage medium on which instructions are stored, which, when loaded to a control device and executed, perform a method for verifying an assignment of a plurality of drives of a machine having a plurality of axles, wherein each of the plurality of drives is assigned to one of the axles and comprises a triggering device, an actuator and a motion sensor, wherein the control device is coupled to each of the triggering device and the motion sensor via associated signal lines, and wherein the control device is configured to control the machine by means of a control program, the method comprising:
 a) the control device outputting a test signal to the triggering device of one of the drives;
 b) in response to the test signal, the triggering device actuating the actuator of the one drive to move a corresponding axle to which the one drive is assigned, wherein the test signal comprises a periodic signal decreasing and increasing in amplitude to cause the corresponding axle respectively to move in respective directions alternatingly aligned with an additional applied external force and in a direction against the additional applied external force, and wherein a slope of an amplitude of the test signal indicates the respective direction of the additional applied external force as being with or against a direction of movement of the axle;
 c) the motion sensor of the one drive detecting the movements of the axle in both directions with or against the additional applied external force, and sending a corresponding motion signal to the control device; and
 d) the control device comparing the test signal with the corresponding motion signal to detect at least one of a cross of the signal lines coupling the control device to the triggering device or a cross of the signal lines coupling the control device to the motion sensor,
 wherein in comparing the test signal with the corresponding motion signal to detect at least one cross, the comparison includes at least one of a step of detecting an inversion of the motion signal relative to the test signal or a step of detecting an alternate indicator of a direction of the additional applied external force with or against the movement of the axle that is opposite to the direction indicated by the slope of the amplitude of the test signal.

* * * * *